United States Patent
Blahnik et al.

(10) Patent No.: US 11,171,029 B2
(45) Date of Patent: Nov. 9, 2021

(54) ELECTRONIC DEVICE MANUFACTURING LOAD PORT APPARATUS, SYSTEMS, AND METHODS

(71) Applicant: Applied Materials, Inc., Santa Clara, CA (US)

(72) Inventors: David T. Blahnik, Round Rock, TX (US); Paul B. Reuter, Austin, TX (US); Luke W. Bonecutter, Cedar Park, TX (US); Douglas B. Baumgarten, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 5 days.

(21) Appl. No.: 16/600,241

(22) Filed: Oct. 11, 2019

(65) Prior Publication Data

US 2020/0043770 A1 Feb. 6, 2020

Related U.S. Application Data

(63) Continuation of application No. 15/348,947, filed on Nov. 10, 2016, now Pat. No. 10,453,726.

(51) Int. Cl.
*H01L 21/677* (2006.01)
*H01L 21/67* (2006.01)

(52) U.S. Cl.
CPC .. *H01L 21/67772* (2013.01); *H01L 21/67126* (2013.01); *H01L 21/67196* (2013.01); *H01L 21/67775* (2013.01)

(58) Field of Classification Search
CPC ........ H01L 21/67772; H01L 21/67126; H01L 21/67775; H01L 21/67196; H01L 21/67778
See application file for complete search history.

(56) References Cited

U.S. PATENT DOCUMENTS

| 4,830,182 | A | 5/1989 | Nakazato et al. |
| 5,139,459 | A | 8/1992 | Takahashi et al. |
| 6,168,364 | B1 * | 1/2001 | Miyajima ......... H01L 21/67772 414/217 |
| 2003/0008602 | A1 | 1/2003 | Ashjaee et al. |
| 2003/0031537 | A1 | 2/2003 | Tokunaga |
| 2004/0013498 | A1 | 1/2004 | Soucy et al. |

(Continued)

FOREIGN PATENT DOCUMENTS

| JP | 2002184831 A | 6/2002 |
| JP | 2002357271 A | 12/2002 |

(Continued)

OTHER PUBLICATIONS

International Search Report and Written Opinion mailed on Application No. PCT/US2017/060962 dated Feb. 20, 2018.

*Primary Examiner* — Glenn F Myers
(74) *Attorney, Agent, or Firm* — Lowenstein Sandler LLP

(57) ABSTRACT

A carrier door opener includes one or more connector devices configured to interface with a door of a substrate carrier located at a load port. The carrier door opener further includes an outer surface forming a groove and a load port seal seated in the groove. The load port seal is configured to seal against a first portion of a planar surface of a panel of the load port around a panel opening formed by the panel. A second portion of the planar surface of the panel is configured to seal to a factory interface.

20 Claims, 5 Drawing Sheets

(56) References Cited

U.S. PATENT DOCUMENTS

| | | | |
|---|---|---|---|
| 2006/0028596 A1* | 2/2006 | Leung | H01L 21/67772 349/58 |
| 2006/0285944 A1 | 12/2006 | Evans | |
| 2007/0183869 A1 | 8/2007 | Cho et al. | |
| 2009/0110518 A1 | 4/2009 | Rice et al. | |
| 2012/0247042 A1 | 10/2012 | Clancy et al. | |
| 2015/0045961 A1* | 2/2015 | Koshti | H01L 21/67248 700/276 |
| 2015/0221538 A1* | 8/2015 | Ochiai | H01L 21/67772 414/217 |
| 2015/0311100 A1 | 10/2015 | Miyajima et al. | |
| 2016/0147235 A1 | 5/2016 | Rice et al. | |
| 2018/0124960 A1 | 5/2018 | Vincent et al. | |
| 2018/0130684 A1 | 5/2018 | Reuter et al. | |
| 2018/0130685 A1 | 5/2018 | Bonecutter et al. | |
| 2018/0130687 A1 | 5/2018 | Bonecutter | |

FOREIGN PATENT DOCUMENTS

| | | |
|---|---|---|
| JP | 2006086308 A | 3/2006 |
| JP | 2014112631 A | 6/2014 |
| JP | 2015146347 A | 8/2015 |
| JP | 63178958 | 10/2016 |
| JP | 2016178133 A | 10/2016 |
| KR | 20150091230 A | 8/2015 |
| WO | 2015/023591 A1 | 2/2015 |

\* cited by examiner

ELECTRONIC DEVICE MANUFACTURING LOAD PORT APPARATUS, SYSTEMS, AND METHODS

RELATED APPLICATION

This application is a continuation application of U.S. patent application Ser. No. 15/348,947, filed Nov. 10, 2016, the entire content of which is hereby incorporated by reference herein.

FIELD

This disclosure relates to electronic device manufacturing and, more particularly, to factory interface load ports.

BACKGROUND

Processing of substrates in semiconductor electronic device manufacturing is generally carried out in multiple process tools, where substrates travel between process tools in substrate carriers, such as, e.g., Front Opening Unified Pods or FOUPs. A substrate carrier may be docked to a load port of a factory interface, such as, e.g., an Equipment Front End Module or EFEM. A factory interface may include a robot substrate handler operable to transfer substrates between a substrate carrier and a process tool. An environmentally-controlled atmosphere may be provided within and between the substrate carrier and the factory interface and the factory interface and a process tool. Poor control of various environmental factors, such as, e.g., levels of humidity, temperature, oxygen, and/or contaminants/particles may adversely affect substrate properties and substrate processing. Existing electronic device manufacturing systems may therefore benefit from improved environmental control at the factory interface.

Accordingly, improved electronic device manufacturing load port apparatus, systems, and methods are desired.

SUMMARY

According to a first aspect, a factory interface of an electronic device manufacturing system is provided. The factory interface comprises a load port configured to interface with a substrate carrier. The load port comprises a panel having a panel opening and a carrier door opener. The carrier door opener seals the panel opening when the carrier door opener is closed, contacts and opens a door of a substrate carrier located at the load port, and comprises a groove along an outer portion of the carrier door opener. The load port also comprises a hollow O-ring seated in the groove. The hollow O-ring is configured to engage the panel when the carrier door opener is closed against the panel.

According to a second aspect, an electronic device manufacturing system is provided. The electronic device manufacturing system comprises a substrate process tool and a factory interface. The factory interface comprises a housing having a front side and a rear side, the front side having a front side opening and the rear side coupled to the substrate process tool. The factory interface also comprises a load port configured to interface with a substrate carrier. The load port comprises a panel coupled to the front side at the front side opening and that has a panel opening. The load port also comprises a carrier door opener that seals the panel opening when the carrier door opener is closed, contacts and opens a door of a substrate carrier located at the load port, and comprises a groove along an outer portion of the carrier door opener. The load port further comprises a hollow O-ring seated in the groove. The hollow O-ring is configured to engage the panel when the carrier door opener is closed against the panel.

According to a third aspect, a method of assembling a factory interface for an electronic device manufacturing system is provided. The method comprises providing a load port configured to interface with a substrate carrier, the load port comprising a panel having a panel opening. The method also comprises providing a carrier door opener that seals the panel opening when the carrier door opener is closed, that contacts and opens a door of a substrate carrier located at the load port, and that comprises a groove along an outer portion of the carrier door opener. The method further comprises seating a hollow O-ring into the groove, the hollow O-ring configured to engage the panel when the carrier door opener is closed against the panel.

Still other aspects, features, and advantages in accordance with these and other embodiments of the disclosure may be readily apparent from the following detailed description, the appended claims, and the accompanying drawings. Accordingly, the drawings and descriptions herein are to be regarded as illustrative in nature, and not as restrictive.

BRIEF DESCRIPTION OF DRAWINGS

The drawings, described below, are for illustrative purposes only and are not necessarily drawn to scale. The drawings are not intended to limit the scope of the disclosure in any way.

DETAILED DESCRIPTION

Reference will now be made in detail to example embodiments of the disclosure, which are illustrated in the accompanying drawings. Wherever possible, the same reference numbers will be used throughout the drawings to refer to the same or like parts.

Electronic device manufacturing may involve maintaining and/or providing controlled environments between various components, such as, e.g., substrate carriers, load ports, factory interfaces, and process tools in order to reduce undesirable humidity, temperature, oxygen, and/or contaminant/particle levels that may adversely affect substrate properties and/or substrate processing. Interfaces between the components may include various seals. These interfaces may be exposed to repeated opening and closing (unsealing and sealing) as various doors, door openers, or similar mechanisms are moved to allow substrates to be transferred from one component to another. The repeated opening and/or closing of some sealing mechanisms may result in undesirable particle generation caused by wear of the materials used for sealing component interfaces. The generated particles may adversely interfere with substrate processing (e.g., by contaminating substrates being processed, affecting processes being performed on the substrates, etc.).

In one aspect, electronic device manufacturing systems in accordance with one or more embodiments of the disclosure include improved load port seals. The improved load port seals in some embodiments may employ a hollow O-ring seated in a particularly shaped and dimensioned groove extending along an outer portion of a carrier door opener. The combination of the hollow O-ring and groove configuration may reduce or eliminate particle generation notwithstanding repeated opening and closing of the carrier door opener as substrates are transferred between substrate carriers and process tools via load ports of factory interfaces. The combination of the hollow O-ring and groove configuration may have other advantages, including, e.g., requiring less force to close a carrier door opener, requiring a less robust design of a carrier door opener and related drive components and other parts, and/or having a larger sealing surface area.

Further details of example embodiments illustrating and describing the improved load port seals, as well as other aspects including methods of assembling a factory interface for an electronic device manufacturing system, will be explained in greater detail below in connection with FIGS. 1-5.

Figure 1:
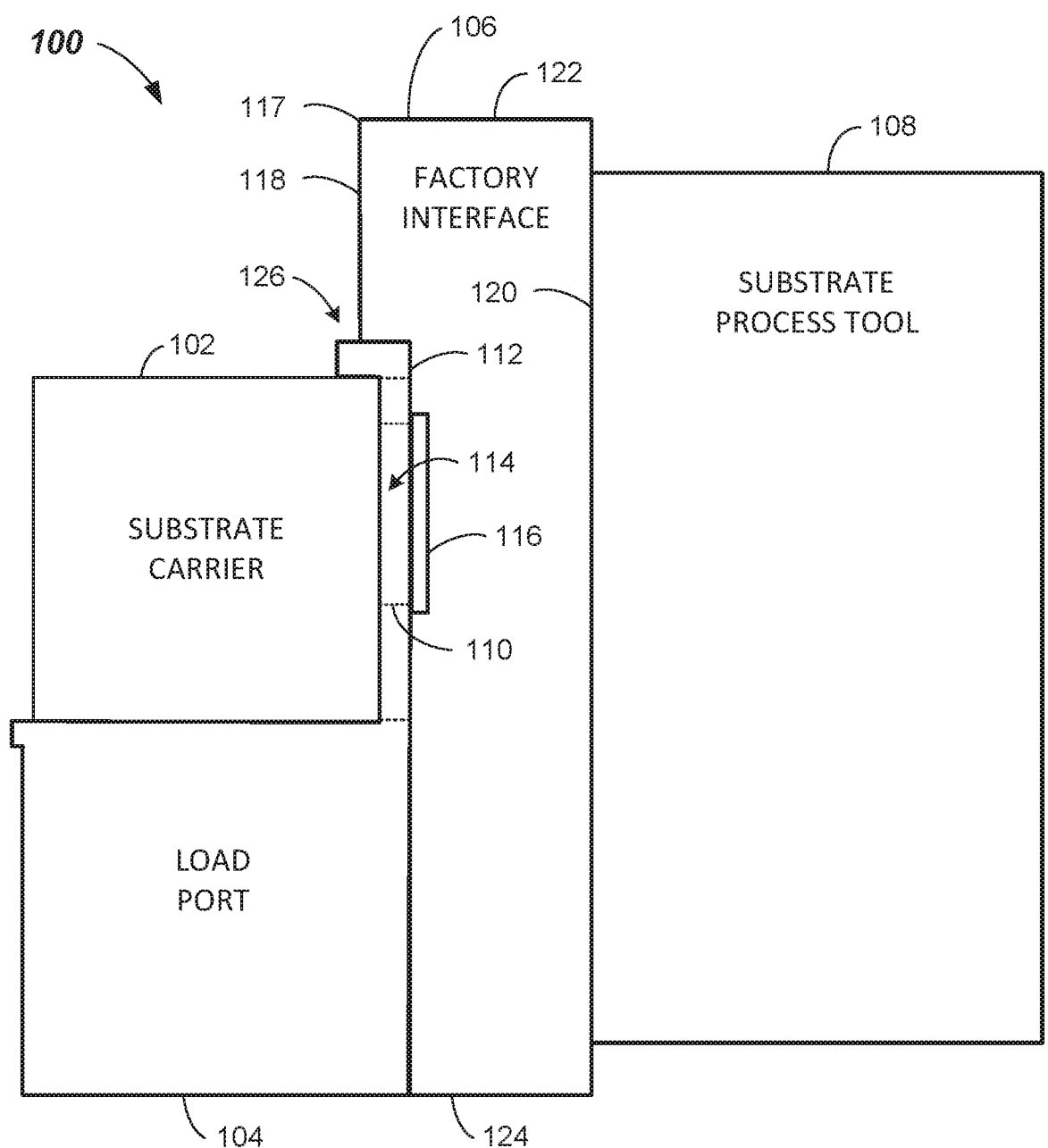
FIG. 1 illustrates a side schematic view of an electronic device manufacturing system according to embodiments of the disclosure.

FIG. 1 illustrates a side schematic view of an electronic device manufacturing system 100 in accordance with one or more embodiments. Electronic device manufacturing system 100 may include a substrate carrier 102, a load port 104, a factory interface 106, and a substrate process tool 108. Load port 104 may be coupled to factory interface 106, which may be coupled to substrate process tool 108. In some embodiments, equipment (e.g., gas supply lines, vacuum pumps, etc., not shown) within and/or coupled to electronic device manufacturing system 100 may place one or more of substrate carrier 102, load port 104, factory interface 106, and substrate process tool 108 in an environmentally-controlled atmosphere (e.g., in a nonreactive and/or inert gas environment, under vacuum or the like) depending on the open or closed state of the mechanisms (e.g., doors, door openers, gate or slit valves, or the like) at the interfaces thereof.

Substrate carrier 102 may be configured to carry one or more substrates. Substrates may be any suitable article used to make electronic devices or circuit components, such as silicon-containing discs or wafers, patterned wafers, glass plates, or the like. Substrate carrier 102 may be, e.g., a Front Opening Unified Pod or FOUP in some embodiments, and may include a carrier door 110. In some embodiments, carrier door 110 may be a FOUP door.

Load port 104 may be configured to receive substrate carrier 102 thereon. Load port 104 may have a panel 112 having a panel opening 114 configured to receive carrier door 110 therein. Load port 104 may also have a carrier door opener 116 configured to contact (that is, e.g., latch onto or otherwise attach to) carrier door 110 and open carrier door 110 to allow the transfer of substrates into and out of substrate carrier 102. In some embodiments, carrier door opener 116 may contact carrier door 110, move carrier door 110 inward (i.e., to right as shown in FIG. 1) enough to clear panel 112, and then move carrier door 110 downward to provide access into substrate carrier 102.

Factory interface 106 may be any suitable enclosure having a housing 117 that has a front side 118, a rear side 120, a top 122, a bottom 124, and two side walls (not separately shown). Front side 118 may have one or more front side openings 126 configured to receive and couple to a respective load port 104. Factory interface 106 may include a robot substrate handler (not shown) configured to transfer substrates from substrate carrier 102 through factory interface 106 to substrate process tool 108.

Substrate process tool 108 may perform one or more processes, such as, e.g., physical vapor deposition (PVD), chemical vapor deposition (CVD), etching, annealing, pre-cleaning, metal or metal oxide removal, or the like, on one or more substrates. Other processes may be carried out on substrates therein. Substrate process tool 108 may include one or more load lock chambers, a transfer chamber, and one or more process chambers (none shown). The one or more load lock chambers may be coupled to factory interface 106, while the transfer chamber may be coupled to the one or more load lock chambers and to the one or more process chambers. The robot substrate handler of factory interface 106 may transfer substrates into and out of the one or more load lock chambers. Substrate process tool 108 may include a transfer robot (not shown) at least partially housed within the transfer chamber. The transfer robot may be configured to transfer substrates to and from the one or more load lock chambers and the one or more process chambers.

Figure 2:
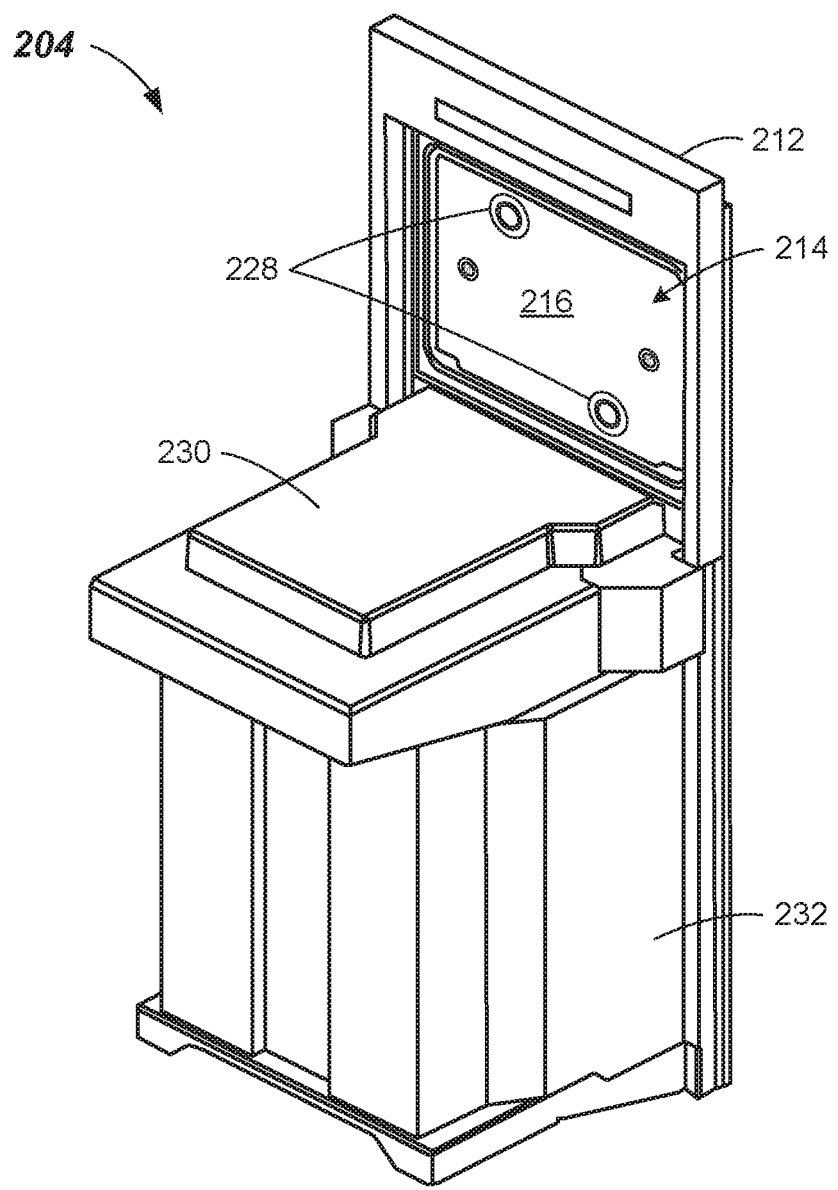
FIG. 2 illustrates a front perspective view of a load port according to embodiments of the disclosure.

FIG. 2 illustrates a front perspective view of a load port 204 in accordance with one or more embodiments. In some embodiments, load port 204 may be identical or similar to load port 104. Load port 204 may include a panel 212 having a panel opening 214. Load port 204 may also include a carrier door opener 216 that seals panel opening 214 when carrier door opener 216 is closed against panel 212. Carrier door opener 216 may have one or more connectors 228 configured to contact and attach to carrier door 110 of substrate carrier 102. Connectors 228 may be, e.g., suction type devices, vacuum devices, etc. Other suitable types of connector devices capable of attaching to carrier door 110 may be used. A mounting table 230 may be provided that extends outward from panel 212. Mounting table 230 may be configured to receive substrate carrier 102 thereon. Various mechanisms (not shown) may be included on and/or around mounting table 230 to lock substrate carrier 102 into a proper position on mounting table 230. Load port 204 may further include a lower portion 232 that may house an opening/closing mechanism (not shown in FIG. 2) coupled to carrier door opener 216 that, in some embodiments, may attach carrier door opener 216 to carrier door 110 and open carrier door 110 as described above in connection with FIG. 1.

Figure 3:
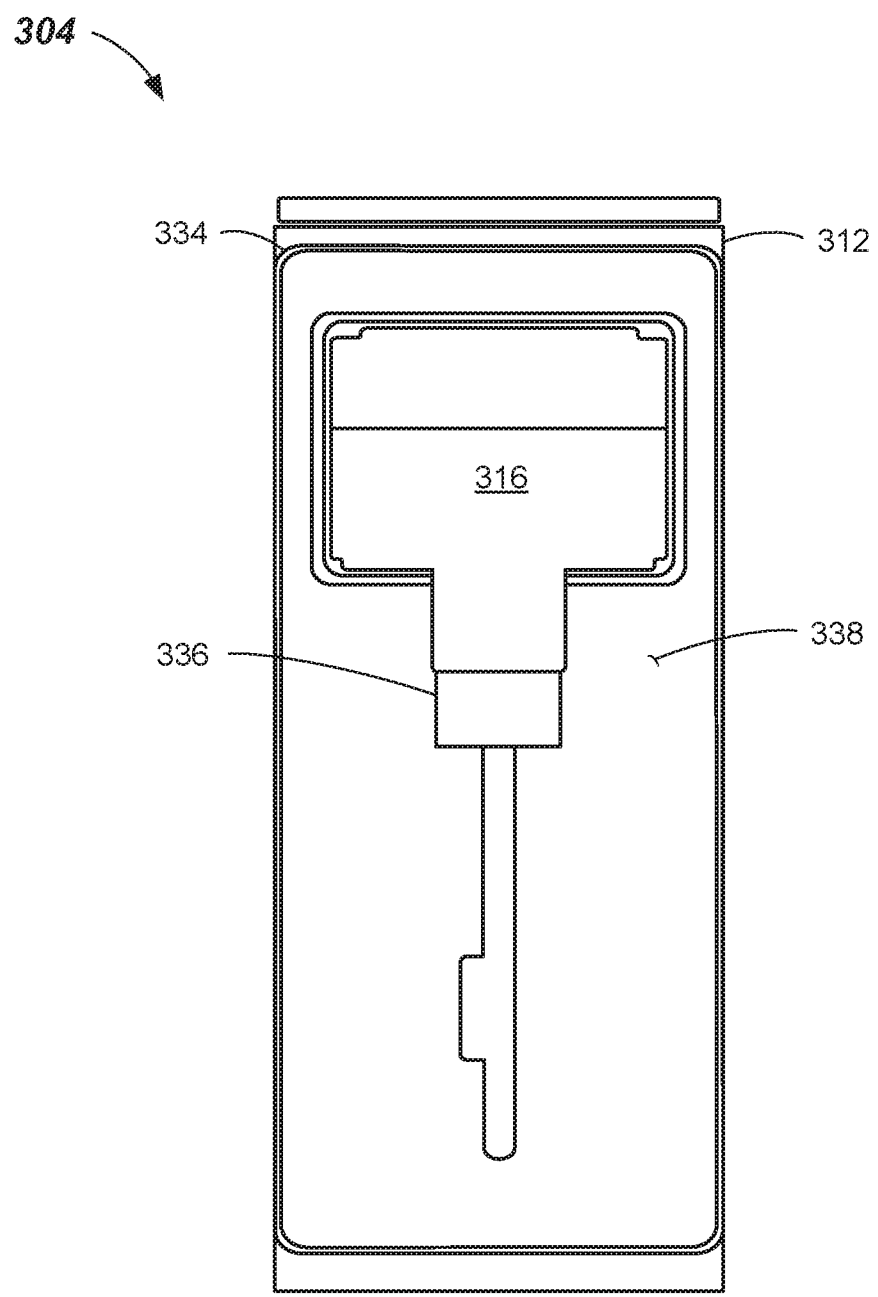
FIG. 3 illustrates a simplified rear elevational view of a load port according to embodiments of the disclosure.

FIG. 3 illustrates a rear view of a load port 304 in accordance with one or more embodiments. In some embodiments, load port 304 may be identical or similar to load ports 104 and/or 204. Load port 304 may include a panel 312 and a seal 334 extending around an outer portion and/or a periphery of panel 312. Seal 334 may seal the interface between load port 304 and a factory interface, such as factory interface 106, when they are coupled together. Load port 304 may also include a carrier door opener 316 that seals a panel opening (not shown in FIG. 3) when carrier door opener 316 is closed against panel 312. Load port 304 may further include an opening/closing mechanism 336 (partially shown in FIG. 3) that may open and close carrier door opener 316 as described above in connections with FIGS. 1 and/or 2. When the carrier door opener 316 attaches to a substrate carrier door (such as substrate carrier door 110 of substrate carrier 102 in FIG. 1), the opening/closing mechanism 336 may retract away from the panel opening and lower the substrate carrier door 110 below the panel opening to allow access to substrates with the substrate carrier. A lift/lower mechanism (not shown) may lower and raise the carrier door opener 316 and any substrate carrier door supported by the carrier door opener 316 relative to the panel opening (panel opening 214 in FIG. 2). Carrier door opener 316 may be slightly larger than the panel opening such that carrier door opener 316 may seal the panel opening by engaging a back surface 338 of panel 312, as described in more detail below.

Figure 4A:
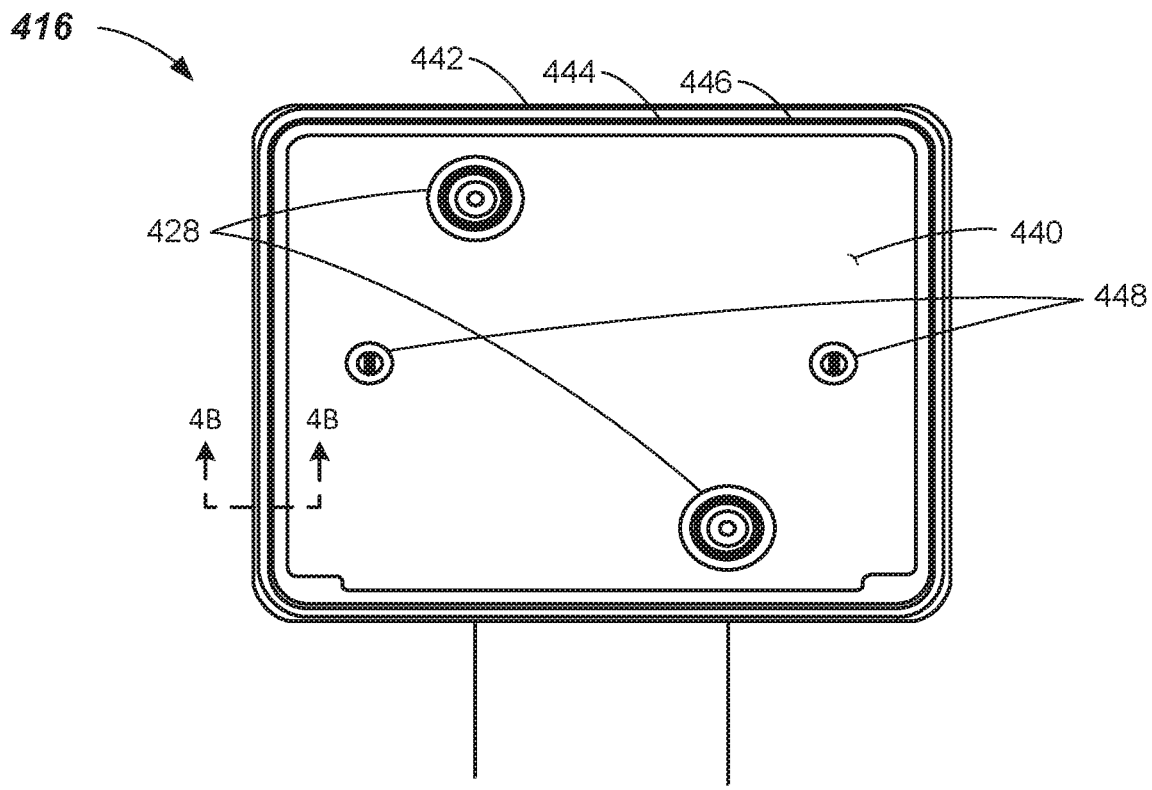
FIG. 4A illustrates a front elevational view of a carrier door opener according to embodiments of the disclosure.
Figure 4B:
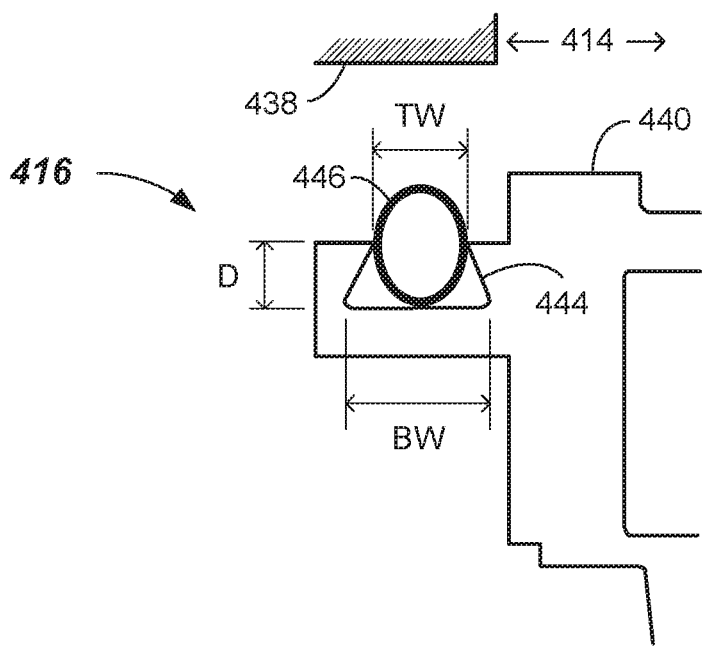
FIG. 4B illustrates a partial cross-sectional view of the carrier door opener taken along section line 4B-4B of FIG. 4A according to embodiments of the disclosure.

FIGS. 4A and 4B illustrate a carrier door opener 416 in accordance with one or more embodiments. In some embodiments, carrier door opener 416 may be identical or similar to carrier door openers 116, 216, and/or 316. FIG. 4A shows a front face 440 of carrier door opener 416. In some embodiments, carrier door opener 416 may have two or more latch keys 428 configured to attach to a FOUP door, which may be identical or similar to carrier door 110 of substrate carrier 102 as described above in connection with FIGS. 1-3. Carrier door opener 416 may have an outer periphery 442 that in some embodiments is rectangular in shape. Other suitable shapes are possible. Carrier door opener 416 may have a groove 444 that extends along an outer portion of carrier door opener 416 and, in some embodiments, extends along the entire outer periphery 442, forming a continuous groove thereabout. Carrier door opener 416 may also have a hollow O-ring 446 seated in groove 444 that is configured to engage a back surface 438 (FIG. 4B) or back surface 338 (FIG. 3) of a panel of a load port (such as panels 112, 212, and/or 312 of respective load ports 104, 204, and/or 304 of FIGS. 1-3) when carrier door opener 416 is closed against the panel. As shown in FIG. 4B, carrier door opener 416 may be slightly larger around the periphery of a panel opening 414 such that carrier door opener 416 may seal panel opening 414 by engaging back surface 438 when closed.

As shown in FIG. 4B, groove 444 may have a cross-sectional shape similar to the shape of a triangular prism frustum. That is, the cross-sectional shape of groove 444 may resemble the basal part of a triangular prism having its upper part cut off by a plane parallel to the base. In the embodiment shown, the interface between the sides and base of the triangular prism are smoothed or rounded. More abrupt side/base interfaces and/or other side/base interface configurations may be used. In some embodiments, groove 444 may have a top width TW ranging from about 5 to 6 mm, a bottom width BW ranging from about 8.5 to 9.5 mm, and a depth D ranging from about 4 to 5 mm. In one or more embodiments, the depth D may be less than a diameter of O-ring 446. In some embodiments, groove 444 may have a top width TW to bottom width BW ratio of about 0.58 to about 0.65. Other suitable groove widths and/or depths may be used.

Hollow O-ring 446 may, in some embodiments, have a wall thickness ranging from about 0.762 to 1.016 mm. In some embodiments, hollow O-ring 446 may have an outside diameter of about 0.22 to 0.27 inches (about 5.6 to 6.85 mm). In some embodiments, hollow O-ring 446 may have a durometer hardness ranging from about 60 to 75. Other suitable wall thicknesses, diameters and/or hardnesses may be used. Hollow O-ring 446 may, in some embodiments, have a slurry finish surface. In one or more embodiments, back surface 438 may have a surface roughness Ra of about 14.5 to 17.5 µin or less. A ratio of a diameter of O-ring 446 to depth D of groove 444 may be about 1.35 to 1.45, for example. Other suitable surface finishes, back surface roughnesses and/or diameter to depth ratios may be employed. Hollow O-ring 446 may be advantageous over a solid core O-ring in that less force may be required to compress and seal hollow O-ring 446 against back surface 438. For example, the force used to seal hollow O-ring 446 at 25% compression may range from about 84 to 216 N (Newtons) for a length of about 52 inches (about 132.1 cm). Further, in some embodiments, the design of carrier door opener 416/groove 444/back surface 438 may be such that hollow O-ring 446 may accommodate an out-of-parallel or out-of-flat condition between these components, such as a +/−0.5 mm out-of-parallel or out-of-flat condition, and still provide an effective seal. Other out-of-parallel or out-of-flat conditions may be accommodated.

In some embodiments, a substrate carrier may have a locking or latching mechanism that secures the substrate carrier door to the substrate carrier. In one or more embodiments, the carrier door opener 416 may include one or more keys or latching mechanisms 448 (FIG. 4A) that interface with and latch, unlatch, lock or unlock a substrate carrier door (e.g., via clockwise or counterclockwise rotation, for example).

Figure 5:
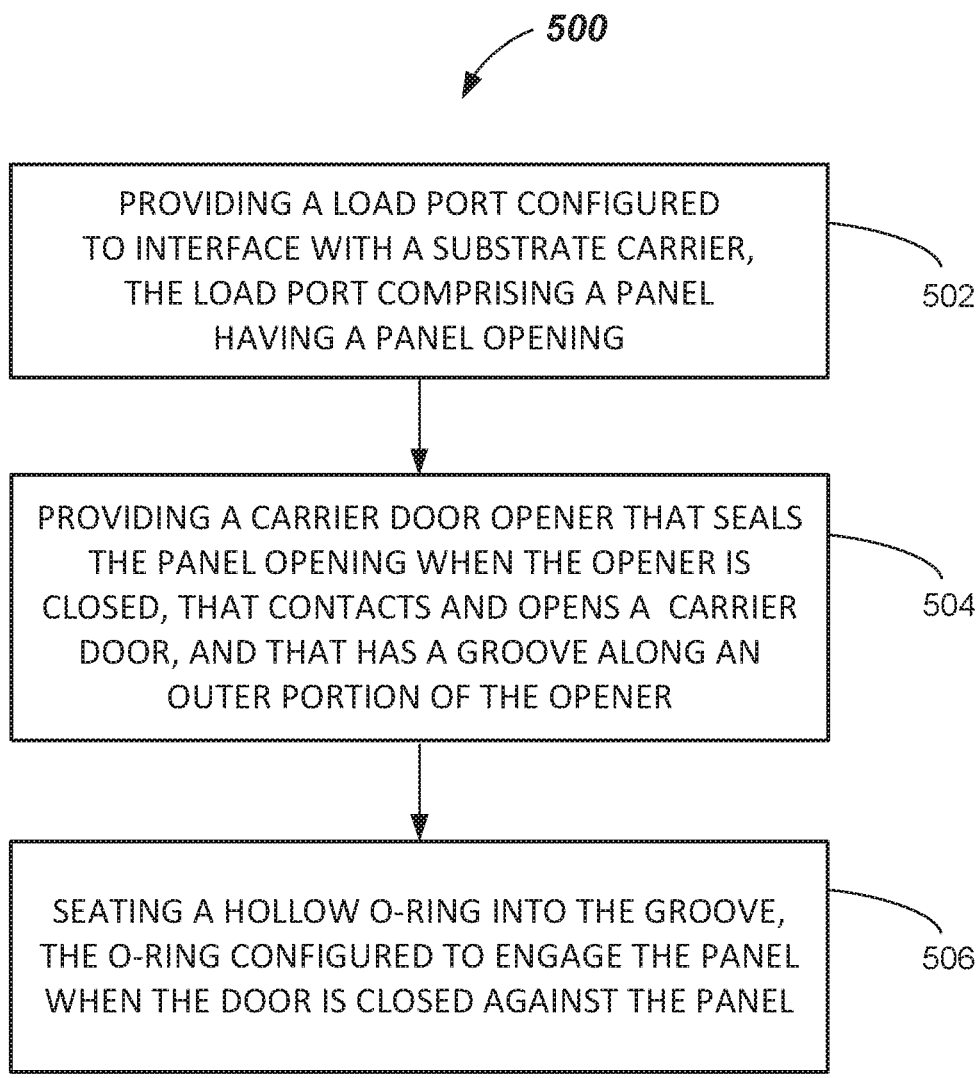
FIG. 5 illustrates a method of assembling a factory interface for an electronic device manufacturing system according to embodiments of the disclosure.

FIG. 5 illustrates a method 500 of assembling a factory interface for an electronic device manufacturing system in accordance with one or more embodiments. At process block 502, method 500 may include providing a load port configured to interface with a substrate carrier, the load port comprising a panel having a panel opening. For example, referring to FIGS. 1 and 2, load port 104 or 204 may be provided that is configured to interface with substrate carrier 102 and may comprise panel 112 or 212 having a panel opening 114 or 214.

At process block 504, a carrier door opener may be provided that seals the panel opening when the carrier door opener is closed, that contacts and opens a door of a substrate carrier located at the load port, and that comprises a groove extending along an outer portion of the carrier door opener. As shown in FIGS. 1, 4A and 4B, e.g., carrier door opener 416 may be provided that may seal panel opening 414 when carrier door opener 416 is closed, that may contact and open a carrier door 110 of substrate carrier 102 located at load port 104, and that may have a groove 444 along an outer portion of carrier door opener 416.

And at process block 506, method 500 may include seating a hollow O-ring into the groove, the hollow O-ring engaging the panel when the carrier door opener is closed against the panel. For example, hollow O-ring 446 may be seated into groove 444, as shown in FIG. 4B. When carrier door opener 416 is closed, hollow O-ring 446 may engage back surface 438 of a panel of a load port.

The above process blocks of method 500 may be executed or performed in an order or sequence not limited to the order and sequence shown and described. For example, in some embodiments, process block 504 may be performed simultaneously with or after process block 502.

The foregoing description discloses only example embodiments of the disclosure. Modifications of the above-disclosed apparatus, systems, and methods may fall within the scope of the disclosure. Accordingly, while example embodiments of the disclosure have been disclosed, it should be understood that other embodiments may fall within the scope of the disclosure, as defined by the following claims.

What is claimed is:

1. A carrier door opener comprising:
one or more connector devices configured to interface with a door of a substrate carrier located at a load port;
an outer surface forming a groove; and a load port seal seated in the groove, wherein the load port seal is configured to seal against a first portion of a planar surface of a panel of the load port around a panel opening formed by the panel, wherein a second portion of the planar surface of the panel is configured to seal to a factory interface, wherein the first portion and the second portion of the planar surface are substantially coplanar.

2. The carrier door opener of claim 1, wherein the one or more connector devices comprise one or more of a suction device or a vacuum device.

3. The carrier door opener of claim 1, wherein the one or more connector devices are configured to retract the door from the substrate carrier.

4. The carrier door opener of claim 1, wherein the groove extends along an outer periphery of the carrier door opener forming a continuous groove.

5. The carrier door opener of claim 1, wherein the groove of the carrier door opener has a cross-sectional shape substantially similar to a triangular prism frustum.

6. The carrier door opener of claim 1, wherein the groove has a depth that is less than a diameter of the load port seal seated in the groove.

7. The carrier door opener of claim 1, wherein the load port seal is an O-ring.

8. A factory interface of an electronic device manufacturing system, wherein the factory interface comprises:
   a load port configured to interface with a substrate carrier; and
   a carrier door opener comprising:
      one or more connector devices configured to interface with a door of the substrate carrier located at the load port;
      an outer surface forming a groove; and
      a load port seal seated in the groove, wherein the load port seal is configured to seal against a first portion of a planar surface of a panel of the load port around a panel opening formed by the panel, wherein a second portion of the planar surface of the panel is configured to seal to the factory interface, wherein the first portion and the second portion of the planar surface are substantially coplanar.

9. The factory interface of claim 8, wherein the one or more connector devices comprise one or more of a suction device or a vacuum device.

10. The factory interface of claim 8, wherein the one or more connector devices are configured to retract the door from the substrate carrier.

11. The factory interface of claim 8, wherein the groove extends along an outer periphery of the carrier door opener forming a continuous groove.

12. The factory interface of claim 8, wherein the groove of the carrier door opener has a cross-sectional shape substantially similar to a triangular prism frustum.

13. The factory interface of claim 8, wherein the groove has a depth that is less than a diameter of the load port seal seated in the groove.

14. The factory interface of claim 8, wherein the load port seal is an O-ring.

15. A method comprising:
   sealing, by a load port seal seated in a groove of an outer surface of a carrier door opener, against a first portion of a planar surface of a panel of a load port around a panel opening formed by the panel, wherein a second portion of the planar surface of the panel is configured to seal to a factory interface, and wherein the first portion and the second portion of the planar surfaces are substantially coplanar; and
   interfacing, by one or more connector devices of the carrier door opener, with a door of a substrate carrier located at the load port.

16. The method of claim 15, wherein the one or more connector devices comprise one or more of a suction device or a vacuum device.

17. The method of claim 15 further comprising retracting, using the one or more connector devices, the door from the substrate carrier.

18. The method of claim 15, wherein the groove extends along an outer periphery of the carrier door opener forming a continuous groove.

19. The method of claim 15, wherein the groove of the carrier door opener has a cross-sectional shape substantially similar to a triangular prism frustum.

20. The method of claim 15, wherein the groove has a depth that is less than a diameter of the load port seal seated in the groove.

* * * * *